(12) United States Patent
Li et al.

(10) Patent No.: US 9,825,063 B2
(45) Date of Patent: Nov. 21, 2017

(54) DISPLAY PANEL AND METHOD OF FABRICATING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jing Li, Beijing (CN); Yulin Cui, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/905,380

(22) PCT Filed: Aug. 18, 2015

(86) PCT No.: PCT/CN2015/087334
§ 371 (c)(1),
(2) Date: Jan. 15, 2016

(87) PCT Pub. No.: WO2016/112684
PCT Pub. Date: Jul. 21, 2016

(65) Prior Publication Data
US 2016/0372489 A1    Dec. 22, 2016

(30) Foreign Application Priority Data

Jan. 14, 2015   (CN) .......................... 2015 1 0018279

(51) Int. Cl.
*H01L 21/12*      (2006.01)
*H01L 21/02*      (2006.01)
(Continued)

(52) U.S. Cl.
CPC ...... *H01L 27/124* (2013.01); *H01L 21/02271* (2013.01); *H01L 21/76802* (2013.01);
(Continued)

(58) Field of Classification Search
CPC ........................ H01L 27/124; H01L 21/76804
(Continued)

(56) References Cited

U.S. PATENT DOCUMENTS

2007/0087486 A1*   4/2007   Tanaka ................ H01L 27/1248
                                                   438/149
2008/0280385 A1    11/2008  Tanaka
(Continued)

FOREIGN PATENT DOCUMENTS

CN         1945855 A      4/2007
CN       101110430 A      1/2008
(Continued)

OTHER PUBLICATIONS

Form PCT/ISA/210 issued in international application No. PCT/CN2015/087334 dated Oct. 29, 2015.
(Continued)

*Primary Examiner* — Moazzam Hossain
*Assistant Examiner* — Omar Mojaddedi
(74) *Attorney, Agent, or Firm* — Nath, Goldberg & Meyer; Joshua B. Goldberg; Annie J. Kock

(57) ABSTRACT

The present invention provides a display panel, a fabricating method thereof and a display device. The display panel comprises a pixel region and a fan-out region, first signal lines and second signal lines are provided to intersect each other in the pixel region, and extend into the fan-out region, respectively, a first insulation layer is provided between the first signal lines and the second signal lines, a second insulation layer is provided on the second signal lines, the second insulation layer comprises at least four layers of
(Continued)

structures, and a density of each layer of structure of the second insulation layer decreases gradually along a direction away from the first insulation layer. A size of the via hole formed in the second insulation layer by etching is smaller than that of the via hole formed in the prior art.

7 Claims, 2 Drawing Sheets

(51) Int. Cl.
H01L 21/768 (2006.01)
H01L 27/12 (2006.01)
H01L 25/065 (2006.01)
H01L 25/00 (2006.01)

(52) U.S. Cl.
CPC .......... *H01L 25/0655* (2013.01); *H01L 25/50* (2013.01); *H01L 27/1259* (2013.01)

(58) Field of Classification Search
USPC ....................................................... 257/774
See application file for complete search history.

(56) References Cited

U.S. PATENT DOCUMENTS

| | | | | |
|---|---|---|---|---|
| 2010/0090995 A1* | 4/2010 | Chung | ................ | G02F 1/13336 345/205 |
| 2013/0021553 A1* | 1/2013 | Satoh | ................ | G02F 1/136227 349/43 |
| 2013/0242215 A1* | 9/2013 | Chang | ............... | G02F 1/136204 349/41 |
| 2015/0187636 A1* | 7/2015 | Ho | .......... | H01L 24/92 257/774 |
| 2016/0043232 A1* | 2/2016 | Uemura | ............ | H01L 29/78606 349/42 |
| 2016/0133650 A1* | 5/2016 | Sugawara | ........... | H01L 29/7869 257/40 |

FOREIGN PATENT DOCUMENTS

| | | |
|---|---|---|
| CN | 202189209 U | 4/2012 |
| CN | 103117249 A | 5/2013 |
| CN | 104538407 A | 4/2015 |
| CN | 204375751 U | 6/2015 |

OTHER PUBLICATIONS

Form PCT/ISA/220 issued in international application No. PCT/CN2015/087334 dated Oct. 29, 2015.
Form PCT/ISA/237 issued in international application No. PCT/CN2015/087334 dated Oct. 29, 2015.
First Office Action dated Dec. 14, 2016 in corresponding Chinese Application No. 201510018279.0.
Office Action dated Apr. 25, 2017 issued in corresponding Chinese Application No. 201510018279.0.

* cited by examiner

DISPLAY PANEL AND METHOD OF FABRICATING THE SAME, AND DISPLAY DEVICE

This is a National Phase Application filed under 35 U.S.C. 371 as a national stage of PCT/CN2015/087334, filed Aug. 18, 2015, an application claiming the benefit of Chinese Application No. 201510018279.0, filed Jan. 14, 2015, the content of each of which is hereby incorporated by reference in its entirety.

FIELD OF THE INVENTION

The present invention relates to the field of display technology, and particularly to a display panel and a method of fabricating the display panel, and a display device.

BACKGROUND OF THE INVENTION

A flat panel display device, as a mainstream display device at present, is widely used in electronic products such as a computer screen, a mobile phone, etc., due to its characteristics of slim shape, power conservation, no radiation, etc.

A display panel is a main component of the flat panel display device. As shown in FIG. 1, the display panel comprises a pixel region 1, a fan-out region 2 and a driving circuit region 3. The pixel region 1 comprises a plurality of gate lines 11 and a plurality of data lines 12 provided to intersect each other, a first insulation layer 13 (generally, a gate insulation layer) is provided between the gate line 11 and the data line 12, a second insulation layer 14 (generally, a passivation layer) is provided on the data line 12, and the gate line 11 and the data line 12 extend into the fan-out region 2, respectively. The driving circuit region 3 comprises gate driving chips for supplying gate scanning signals to the gate lines 11, and source driving chips for supplying data voltage signals to the data lines 12. As shown in FIGS. 2 and 3, a first via hole 15 penetrating through the first insulation layer 13 and the second insulation layer 14 is formed on the gate line 11 in the fan-out region 2, and a second via hole 16 penetrating through the second insulation layer 14 is formed on the data line 12 in the fan-out region 2, so that the gate driving chip is electrically connected with the gate line 11 through the first via hole 15, and the source driving chip is electrically connected with the data line 12 through the second via hole 16. The first via hole 15 and the second via hole 16 are generally formed by one patterning process, thereby reducing processing steps and saving costs.

The inventor found at least the following problem existing in the prior art. Since the first via hole 15 and the second via hole 16 are formed by one patterning process, the time spent in forming these two kinds of via holes by etching is the same. However, both of the first insulation layer 13 and the second insulation layer 14 are required to be etched when forming the first via hole 15, while only the second insulation layer 14 is required to be etched when forming the second via hole 16. Therefore, under the condition of the same etching time, an opening size of the second via hole 16 formed by etching is inevitably larger than that of the first via hole 15 formed by etching. In a case where pins of the gate driving chip are just completely inserted into the first via holes 15, i.e., the pins of the gate driving chip are completely wrapped by walls of the first via hole 15, since the opening size of the second via hole 16 is relatively large, it cannot be guaranteed that the pins of the source driving chip are completely wrapped by walls of the second via hole 16 when inserting the pins of the source driving chip into the second via holes 16, and consequently, the data line 12 below the second via hole 16 is exposed to be contaminated by external environment (water vapor, oxygen, etc.), thereby causing a connection failure and affecting a display effect.

SUMMARY OF THE INVENTION

In order to solve the problem existing in the via holes of the fan-out region of the display panel in the prior art, the embodiments of the present invention provide a display panel and a method of fabricating the same, and a display device, which can effectively solve the problem that the pins of the driving chip cannot be wrapped completely due to relatively large size of the opening, thereby avoiding the failure caused by the exposure of the data lines below the pins.

An embodiment of the present invention provides a display panel, comprising a pixel region and a fan-out region, a plurality of first signal lines and a plurality of second signal lines are provided to intersect each other in the pixel region, the first signal lines and the second signal lines extend into the fan-out region, respectively, a first insulation layer is provided between the first signal lines and the second signal lines, a second insulation layer is provided on the second signal lines, the second insulation layer comprises at least four layers of structures, and a density of each layer of structure of the second insulation layer decreases gradually along a direction away from the first insulation layer.

Each layer of structure of the second insulation layer may be made of the same material.

The display panel may further comprise a driving circuit region, the fan-out regions is provided between the pixel region and the driving circuit region, the driving circuit region comprises first driving chips and second driving chips, the first driving chip is electrically connected with the first signal lines through first via holes penetrating through the first insulation layer and the second insulation layer in the fan-out region, and the second driving chip is electrically connected with the second signal lines through second via holes penetrating through the second insulation layer in the fan-out region.

The second via hole may have a step-like inner wall, and each step is positioned at an interface between any two adjacent layers of structures in the second insulation layer.

A diameter of a circle formed by each step may sequentially increase along the direction away from the first insulation layer.

The second insulation layer may comprise four layers of structures. Thicknesses of the four layers of structures of the second insulation layer may be sequentially in ranges of 10 nm to 50 nm, 50 nm to 500 nm, 50 nm to 500 nm and 10 nm to 50 nm along the direction away from the first insulation layer.

Etch rates of the four layers of structures of the second insulation layer may be sequentially in ranges of 300 nm/min to 600 nm/min, 300 nm/min to 800 nm/min, 300 nm/min to 1000 nm/min and 300 nm/min to 1500 nm/min along the direction away from the first insulation layer.

The etch rate of the second layer of structure may be smaller than that of the third layer of structure by 100 nm/min to 700 nm/min in the four layers of structures of the second insulation layer.

The first signal line is a gate line, the second signal line is a data line, the first driving chip is a gate driving chip, and the second driving chip is a source driving chip.

Alternatively, the first signal line is a data line, the second signal line is a gate line, the first driving chip is a source driving chip, and the second driving chip is a gate driving chip.

Another embodiment of the present invention provides a method of fabricating a display panel, the display panel comprises a pixel region and a fan-out region, the method comprises steps of sequentially forming first signal lines, a first insulation layer, second signal lines and a second insulation layer on a substrate, the first signal lines and the second signal lines are provided in the pixel region to intersect each other, and extend from the pixel region into the fan-out region, respectively, the step of forming the second insulation layer comprises sequentially forming, on the substrate having the second signal lines formed thereon, at least four layers of insulation films whose densities decrease gradually, to form the layers of structures of the second insulation layer.

Each layer of structure of the second insulation layer may be made of the same material.

The second insulation layer may comprise four layers of structures, the step of sequentially forming the four layers of structures of the second insulation layer on the substrate having the second signal lines formed thereon comprises: forming the second insulation layer by a chemical vapor deposition process using reaction gases of $NH_3$, $N_2$ and $SiH_4$ under a temperature ranging from 250° C. to 400° C. When forming the first layer of structure of the second insulation layer, a flow rate of $SiH_4$ ranges from 500 sccm to 1500 sccm, a flow rate of $NH_3$ ranges from 2000 sccm to 4000 sccm, a flow rate of $N_2$ ranges from 10000 sccm to 30000 sccm, a reaction power ranges from 3000 W to 6000 W, a reaction pressure ranges from 500 mtorr to 1000 mtorr, and a reaction distance ranges from 500 mils to 1500 mils. When forming the second layer of structure of the second insulation layer, the flow rate of $SiH_4$ ranges from 1000 sccm to 2000 sccm, the flow rate of $NH_3$ ranges from 3000 sccm to 5000 sccm, the flow rate of $N_2$ ranges from 10000 sccm to 30000 sccm, the reaction power ranges from 3000 W to 7000 W, the reaction pressure ranges from 800 mtorr to 1500 mtorr, and the reaction distance ranges from 800 mils to 1500 mils. When forming the third layer of structure of the second insulation layer, the flow rate of $SiH_4$ ranges from 1000 sccm to 2000 sccm, the flow rate of $NH_3$ ranges from 3000 sccm to 7000 sccm, the flow rate of $N_2$ ranges from 10000 sccm to 30000 sccm, the reaction power ranges from 3000 W to 7000 W, the reaction pressure ranges from 1000 mtorr to 2500 mtorr, and the reaction distance ranges from 800 mils to 1500 mils. When forming the fourth layer of structure of the second insulation layer, the flow rate of $SiH_4$ ranges from 1000 sccm to 2000 sccm, the flow rate of $NH_3$ ranges from 4000 sccm to 8000 sccm, the flow rate of $N_2$ ranges from 10000 sccm to 30000 sccm, the reaction power ranges from 5000 W to 7000 W, the reaction pressure ranges from 2000 mtorr to 3000 mtorr, and the reaction distance ranges from 800 mils to 1500 mils.

The display panel may further comprise a driving circuit region, the fan-out region is provided between the pixel region and the driving circuit region, the driving circuit region comprises first driving chips and second driving chips, after forming the second insulation layer, the method may further comprise forming first via holes penetrating through the first insulation layer and the second insulation layer in the fan-out region, and forming second via holes penetrating through the second insulation layer in the fan-out region by patterning process, so that the first driving chip is electrically connected with the first signal lines through the first via holes, and the second driving chip is electrically connected with the second signal lines through the second via holes.

The second via hole may have a step-like inner wall, and each step is positioned at an interface between any two adjacent layers of structures in the second insulation layer.

A diameter of a circle formed by each step may increase sequentially along a direction away from the first insulation layer.

Thicknesses of the four layers of structures of the second insulation layer may be sequentially in ranges of 10 nm to 50 nm, 50 nm to 500 nm, 50 nm to 500 nm and 10 nm to 50 nm along a direction away from the first insulation layer.

Etch rates of the four layers of structures of the second insulation layer may be sequentially in ranges of 300 nm/min to 600 nm/min, 300 nm/min to 800 nm/min, 300 nm/min to 1000 nm/min and 300 nm/min to 1500 nm/min along a direction away from the first insulation layer.

The etch rate of the second layer of structure may be smaller than that of the third layer of structure by 100 nm/min to 700 nm/min in the four layers of structures of the second insulation layer.

Yet another embodiment of the present invention provides a display device, comprising the above described display panel.

In the display panel of the embodiment of the present invention, since the second insulation layer having at least four layers of structures is utilized, and the density of each layer of structure in the second insulation layer decreases gradually along the direction away from the first insulation layer, the via hole having a step-like inner wall is formed after etching the second insulation layer with such structure, and the aperture of the via hole is reduced accordingly, so as to avoid occurrence of exposure of the signal line.

By the method of fabricating a display panel in the embodiment of the present invention, the above described display panel may be fabricated, the process of the method is simple and easy to implement.

The display device of the embodiment of the present invention comprises the above described display panel, the yield of the display device is high and the display quality thereof is good.

DESCRIPTION OF THE PREFERRED EMBODIMENT

Figure 1:
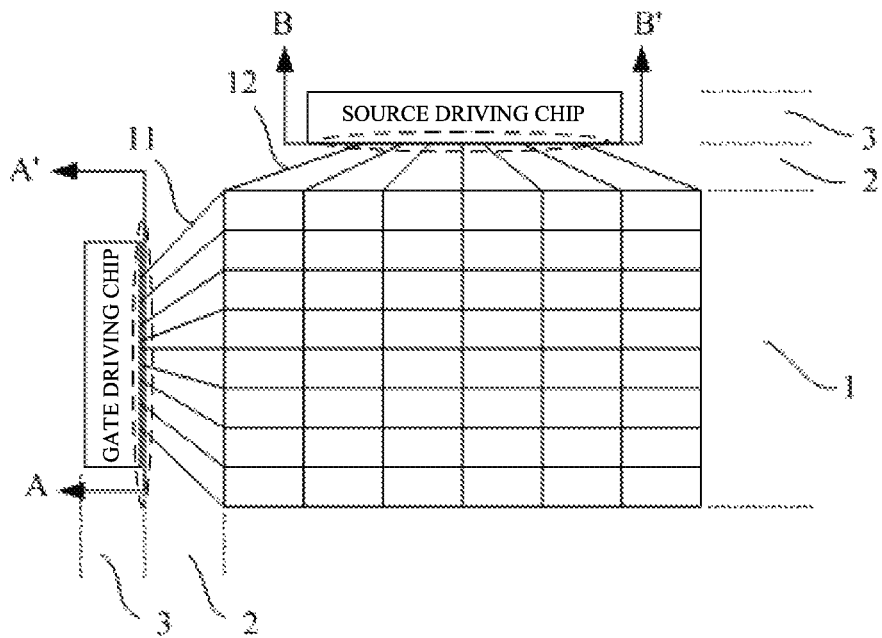
FIG. 1 is a schematic diagram of a display panel in the prior art.
Figure 2:
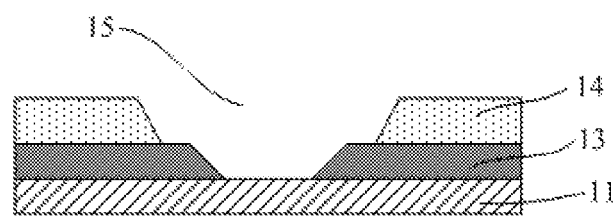
FIG. 2 is a cross-sectional view taken along line A-A' of FIG. 1.
Figure 3:
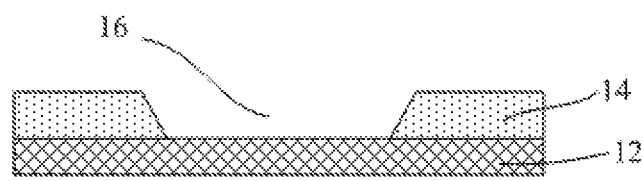
FIG. 3 is a cross-sectional view taken along line B-B' of FIG. 1.

To make those skilled in the art better understand the technical solutions of the present invention, the present invention will be further described below in detail in conjunction with the accompanying drawings and specific embodiments.

An embodiment of the present invention provides a display panel comprising a pixel region and a fan-out region, the pixel region comprises a plurality of first signal lines and a plurality of second signal lines provided to intersect each other, the first signal lines and the second signal lines extend into the fan-out region, respectively, a first insulation layer is provided between the first signal lines and the second signal lines, a second insulation layer is provided on the second signal lines, the second insulation layer comprises at least four layers of structures, and a density of each layer of structure decreases gradually along a direction away from the first insulation layer.

A person skilled in the art may understand that, the signal lines on the display panel are electrically connected with a driving chip, so as to supply signals to pixel units connected with the signal lines from the driving chip. These signal lines extend from the pixel region into the fan-out region. By etching via holes at positions of the fan-out region corresponding to the signal lines, and inserting pins of the driving chip into the via holes, the driving chip is electrically connected with the signal lines. However, these signal lines are not provided in the same layer, and thus depths of the via holes are different either. In the prior art, in order to increase productivity and save costs, these via holes are generally formed by one patterning process, and thus apertures of the via holes with relatively small depths are relatively large. Consequently, the pins of the driving chip cannot be completely wrapped by walls of the via holes after being inserted into the via holes, which results in exposure of a portion of the signal line below the via hole and further causes failure of the signal line, thereby affecting a display effect.

In the embodiment, the structure of the insulation layer (the second insulation layer) having shallow via holes formed therein is changed, i.e., the second insulation layer having at least four layers of structures is utilized, and the density of each layer of structure in the second insulation layer decreases gradually along the direction away from the first insulation layer (the gate insulation layer). When etching the second insulation layer with such structure, the via hole having a step-like inner wall is formed, and the aperture of the via hole is reduced accordingly, so as to avoid occurrence of exposure of the signal line, and flexibly change a monitored size in production.

Specifically, in an embodiment of the present invention, a display panel comprises a pixel region, a fan-out region and a driving circuit region, each fan-out region is provided between the pixel region and the driving circuit region. First signal lines and second signal lines intersecting each other in different planes are provided in the pixel region, and the first signal lines and the second signal lines extend into the fan-out region, respectively. A first driving chip and a second driving chip are provided in the driving circuit region. A first insulation layer is provided between a layer where the first signal lines are provided and a layer where the second signal lines are provided, and a second insulation layer is provided on the second signal lines. The first driving chip is electrically connected with the first signal lines through first via holes penetrating through the first insulation layer and the second insulation layer on the first signal lines in the fan-out region, and the second driving chip is electrically connected with the second signal lines through second via holes penetrating through the second insulation layer on the second signal lines in the fan-out region. In addition, the second insulation layer in the embodiment comprises at least four layers of structures, and a density of each layer of structure of the second insulation layer decreases gradually along a direction away from the first insulation layer.

Figure 4:
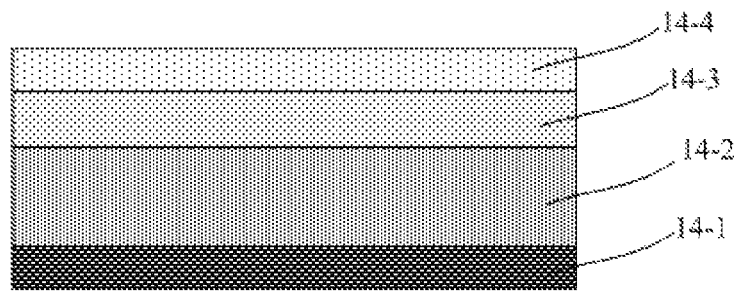
FIG. 4 is a schematic diagram of a second insulation layer (a passivation layer) of a display panel according to an embodiment of the present invention.
Figure 5:
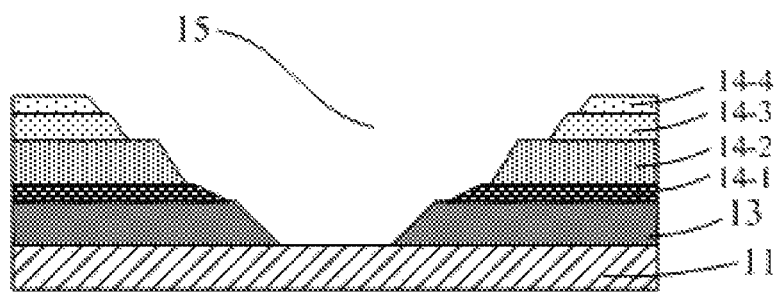
FIG. 5 is a schematic diagram of forming a first via hole of a display panel according to an embodiment of the present invention.
Figure 6:
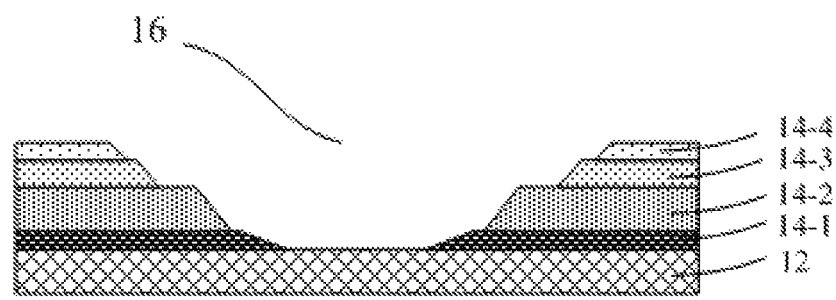
FIG. 6 is a schematic diagram of forming a second via hole of a display panel according to an embodiment of the present invention.

As shown in FIGS. 4 through 6, in the embodiment, for example, the first signal lines may be gate lines 11, the second signal lines may be data lines 12, the first driving chip may be a gate driving chip, and the second driving chip may be a source driving chip. It should be understood that, alternatively, the first signal lines may be data lines 12, the second signal lines may be gate lines 11, the first driving chip may be a source driving chip, and the second driving chip may be a gate driving chip.

In the embodiment, the plurality of gate lines 11 and the plurality of data lines 12 intersecting each other define a plurality of pixel units, a gate insulation layer 13 (the first insulation layer) is provided between the gate lines 11 and the data lines 12, and a passivation layer 14 (the second insulation layer) is provided on the data lines 12. The first via holes 15 are etched in the gate insulation layer 13 and the passivation layer 14 formed on the gate lines 11, close to the driving circuit region, in the fan-out region, to penetrate through the gate insulation layer 13 and the passivation layer 14, and the second via holes 16 are etched in the passivation layer 14 formed on the data lines 12 to penetrate through the passivation layer 14. In this case, the pins of the gate driving chip of the driving circuit region are electrically connected with the gate lines 11 through the first via holes 15, so as to supply gate scanning signals to the gate lines 11, and the pins of the source driving chip are electrically connected with the data lines 12 through the second via holes 16, so as to supply data voltage signals to the data lines 12. In the embodiment, the passivation layer 14 comprises at least four layers of structures, i.e., the structures 14-1, 14-2, 14-3 and 14-4 shown in FIG. 4, and the density of each layer of structure decreases gradually along the direction away from the gate insulation layer 13, so that the inner wall of the second via hole 16 formed by etching the passivation layer 14 has a circular step-like shape. It could be understood that, the densities of two adjacent layers of structures are different, and thus etched degrees of the two layers of structures are also different, i.e., an aperture of the via hole formed in the layer of structure with a larger density is smaller than that of the via hole formed in the layer of structure with a smaller density, so that a step is easily formed at an interface between the adjacent layers of structures, and further, the aperture of the inner wall of the second via hole 16 gradually increases along the direction away from the gate insulation layer 13. In this case, a diameter of the pin that can be held by the second via hole 16 is actually the smallest aperture in the inner wall of the second via hole 16, i.e., the aperture of the via hole formed by etching the layer of structure with the largest density. Therefore, compared with a via hole formed by etching a passivation layer 14 with one layer of structure in the prior art, the aperture of the second via hole 16 in the embodiment is smaller, thereby avoiding the exposure of the data line caused when the pins of the source driving chip cannot be completely wrapped by the second via hole 16 due to the large aperture of the second via hole 16, and further avoiding the display failure.

It should be noted that, it is required to etch the passivation layer 14 and the gate insulation layer 13 when forming the first via hole 15, and the first via hole 15 and the second via hole 16 are formed in the same patterning process. Therefore, the change in structure of the passivation layer 14 may also have a certain impact on the aperture of the first via hole 15. However, it could be understood that, the density of the gate insulation layer 13 is larger than that of the layer of structure with the largest density in the passivation layer 14 (i.e., the first layer of structure 14-1 of the passivation layer 14), and thus the aperture of the first via hole 15 depends on the gate insulation layer 13. Further, even if the same etching time as that in the prior art is spent, the aperture of the formed first via hole 15 may decrease to some extent due to the increasing difficulty in etching, but it will not prevent the pins of the gate driving chip from being inserted into the first via holes 15, and instead, the pins can be inserted into the first via holes 15 to be connected with the gate lines, as long as a small force is applied to press down the gate driving chip.

For example, each layer of structure of the passivation layer 14 is made of the same material. In this case, when forming the layers of structures of the passivation layer 14, the process becomes simple and the productivity can be increased. It could be understood that, layers of structures of the passivation layer 14 may be made of different materials, as long as the densities of the respective layers of structures of the passivation layer sequentially decrease along the direction away from the gate insulation layer 13, and the inner wall of the second via hole 16 formed after the passivation layer 14 is etched has a step-like shape. For example, in the embodiment, the material of the passivation layer 14 may be, but not limited to, silicon nitride, and may also be other insulation material such as silicon oxide, etc.

As described above, the passivation layer 14 in the embodiment may be a passivation layer having four layers of structures. It is verified by experiments that, when the passivation layer 14 has two layers or three layers of structures having densities decreasing gradually, the via hole having the step-like inner wall cannot be formed, but a via hole having a convex arc-shaped inner wall is formed, after etching the passivation layer 14. It could be understood that, the via hole of this kind still cannot completely wrap the pins of the driving chip. In addition, when the passivation layer 14 has five layers or more layers of structures, although the via hole having the step-like inner wall can be formed after etching the passivation layer 14, the process inevitably becomes complicated, the fabrication costs are increased and the efficiency is reduced, as the number of layers of structures of the passivation layer 14 increases. However, the passivation layer 14 having four layers of structures has a simple structure, and in this case, the via hole having the step-like inner wall may be formed after etching, the pins of the driving chip can be completely wrapped, and thus the problem of failure caused by the exposed data line existing in the prior art can be solved. Further, it is easy to fabricate of the passivation layer 14 with four layers of structures, and thus the fabrication time is saved and the productivity is increased.

Specifically, as for the four layers of structures 14-1, 14-2, 14-3 and 14-4 included in the passivation layer 14, the thicknesses of the four layers of structures are in ranges of 10 nm to 50 nm, 50 nm to 500 nm, 50 nm to 500 nm and 10 nm to 50 nm, respectively. However, the embodiment is not limited thereto, and other ranges of the thicknesses may be set according to the specific situation. It should be noted that, after several experiments, it is found that the steps are formed more easily in the inner wall of the second via hole 16 in the process of forming the second via hole 16 by etching, when the thicknesses of the first layer of structure 14-1 and the fourth layer of structure 14-4 of the passivation layer 14 have no big difference, the thicknesses of the second layer of structure 14-2 and the third layer of structure 14-3 have no big difference, and both of the thicknesses of the first layer of structure 14-1 and the fourth layer of structure 14-4 are smaller than those of the second layer of structure 14-2 and the third layer of structure 14-3, as shown in FIG. 6.

Specifically, as for the four layers of structures 14-1, 14-2, 14-3 and 14-4 included in the passivation layer 14, etch rates of the four layers of structures are in ranges of 300 nm/min to 600 nm/min, 300 nm/min to 800 nm/min, 300 nm/min to 1000 nm/min, and 300 nm/min to 1500 nm/min, respectively. It could be understood that, the density of each layer of structure may be represented by the etch rate of the layer of structure in the passivation layer 14, the layer of structure having a relatively large density has a relatively low etch rate, and the layer of structure having a relatively small density has a relatively high etch rate. Meanwhile, the density of each layer of structure of the passivation layer 14 may be set appropriately, so that the inner wall of the second via hole 16 formed by etching the passivation layer 14 are more likely to have annular steps. It is verified by experiments that, when the etch rate of the second layer of structure 14-2 of the passivation layer 14 is smaller than that of the third layer of structure 14-3 by 100 nm/min to 700 nm/min, that is, when the difference between the densities of the second layer of structure 14-2 and the third layer of structure 14-3 is relatively large, relatively perfect annular steps may be formed on the inner wall of the second via hole 16 formed by etching the passivation layer 14. In this case, the diameter of the annular (circular) step formed at the interface between the second layer of structure 14-2 and the third layer of structure 14-3 of the passivation layer 14 may be regarded as the aperture of the second via hole 16 to be monitored.

Another embodiment of the present invention provides a method of fabricating a display panel, and the display panel may be the display panel described in the above embodiment. The display panel comprises a pixel region, a fan-out region and a driving circuit region. The fan-out region is provided between the pixel region and the driving circuit region. The pixel region comprises a plurality of first signal lines and a plurality of second signal lines intersecting each other, and the first signal lines and the second signal lines extend into the fan-out region, respectively. A first insulation layer is provided between the first signal lines and the second signal lines, and a second insulation layer is provided on the second signal lines. The second insulation layer comprises at least four layers of structures, and a density of each layer of structure decreases gradually along a direction away from the first insulation layer. The driving circuit region comprises first driving chips and second driving chips. The first driving chips are electrically connected with the first signal lines through first via holes penetrating through the first insulation layer and the second insulation layer in the fan-out region, and the second driving chips are electrically connected with the second signal lines through second via holes penetrating through the second insulation layer in the fan-out region.

In the embodiment, for example, the second insulation layer comprises four layers of structures, and the four layers of structures are made of the same material, which may be silicon nitride.

The method of fabricating the display panel in the embodiment comprises the following steps 1 to 3.

In step 1, a pattern of the first signal lines and the first insulation layer are formed on a substrate.

Specifically, in this step, the substrate is made of transparent material such as glass and is subjected to a pre-cleaning process. For example, a first metal film is formed on the substrate by sputtering, thermal evaporation, plasma enhanced chemical vapor deposition (PECVD), low pressure chemical vapor deposition (LPCVD), atmospheric pressure chemical vapor deposition (APCVD) or electron cyclotron resonance chemical vapor deposition (ECR-CVD), a pattern of the first signal lines is formed by performing a patterning process comprising exposure, development, etching and stripping on the first metal film, and then the first insulation layer is formed by plasma enhanced chemical vapor deposition, low pressure chemical vapor deposition, atmospheric pressure chemical vapor deposition or electron cyclotron resonance chemical vapor deposition or sputtering.

In step 2, a pattern of the second signal lines and the second insulation layer are formed on the substrate subjected to the above step, by patterning process. In this step, the method of forming the second signal lines is the same as that of forming the first signal lines, and the detailed description thereof is omitted herein. In particular, in this step, the method of forming the second insulation layer is different from that of forming the first insulation layer. Taking a case where the material of the second insulation layer is silicon nitride as an example, the step of forming the second insulation layer specifically comprises: sequentially forming the first layer to the fourth layer of the second insulation layer by a chemical vapor deposition process using reaction gases of $NH_3$, $N_2$ and $SiH_4$ under a temperature ranging from 250° C. to 400° C., and the specific processing conditions will be respectively described as follows.

When forming the first layer of structure of the second insulation layer, a flow rate of $SiH_4$ ranges from 500 sccm to 1500 sccm, a flow rate of $NH_3$ ranges from 2000 sccm to 4000 sccm, a flow rate of $N_2$ ranges from 10000 sccm to 30000 sccm, a reaction power ranges from 3000 W to 6000 W, a reaction pressure ranges from 500 mtorr to 1000 mtorr, and a reaction distance ranges from 500 mils to 1500 mils. When forming the second layer of structure of the second insulation layer, the flow rate of $SiH_4$ ranges from 1000 sccm to 2000 sccm, the flow rate of $NH_3$ ranges from 3000 sccm to 5000 sccm, the flow rate of $N_2$ ranges from 10000 sccm to 30000 sccm, the reaction power ranges from 3000 W to 7000 W, the reaction pressure ranges from 800 mtorr to 1500 mtorr, and the reaction distance ranges from 800 mils to 1500 mils.

When forming the third layer of structure of the second insulation layer, the flow rate of $SiH_4$ ranges from 1000 sccm to 2000 sccm, the flow rate of $NH_3$ ranges from 3000 sccm to 7000 sccm, the flow rate of $N_2$ ranges from 10000 sccm to 30000 sccm, the reaction power ranges from 3000 W to 7000 W, the reaction pressure ranges from 1000 mtorr to 2500 mtorr, and the reaction distance ranges from 800 mils to 1500 mils.

When forming the fourth layer of structure of the second insulation layer, the flow rate of $SiH_4$ ranges from 1000 sccm to 2000 sccm, the flow rate of $NH_3$ ranges from 4000 sccm to 8000 sccm, the flow rate of $N_2$ ranges from 10000 sccm to 30000 sccm, the reaction power ranges from 5000 W to 7000 W, the reaction pressure ranges from 2000 mtorr to 3000 mtorr, and the reaction distance ranges from 800 mils to 1500 mils.

It should be noted that, a specific embodiment is provided in the above step, but the four layers of structures of the second insulation layer may be formed by adjusting the flow rates of the gases and controlling the reaction power, the reaction pressure and the reaction distance in practical applications. In the above step, the flow rate of $SiH_4$ ranges from 1000 sccm to 2000 sccm, the flow rate of $NH_3$ ranges from 2000 sccm to 8000 sccm, the flow rate of $N_2$ ranges from 10000 sccm to 30000 sccm, the reaction power ranges from 3000 W to 7000 W, the reaction pressure ranges from 500 mtorr to 3000 mtorr, and the reaction distance ranges from 500 mils to 1500 mils. Meanwhile, it should be noted that, the flow rates of gases, the reaction power, the reaction pressure and the reaction distance differ in forming the respective layers of structures of the second insulation layer, so that the four layers of structures having different densities can be formed. How to control the flow rates of gases, the reaction power, the reaction pressure and the reaction distance so as to form films of the same material but having different densities are well known to a person skilled in the art, and the description thereof is omitted herein.

As for the four layers of structures included in the second insulation layer, the thicknesses of the four layers of structures are in ranges of 10 nm to 50 nm, 50 nm to 500 nm, 50 nm to 500 nm and 10 nm to 50 nm, respectively. However, the embodiment is not limited thereto, and other ranges of thicknesses may be set according to the specific situation. It should be noted that, after several experiments, it is found that the steps are formed more easily in the inner wall of the second via hole in a subsequent step of forming the second via hole by etching, when the thicknesses of the first layer of structure and the fourth layer of structure of the second insulation layer have no big difference, the thicknesses of the second layer of structure and the third layer of structure have no big difference, and both of the thicknesses of the first layer of structure and the fourth layer of structure are smaller than those of the second layer of structure and the third layer of structure.

As for the four layers of structures included in the second insulation layer, etch rates of the four layers of structures are in ranges of 300 nm/min to 600 nm/min, 300 nm/min to 800 nm/min, 300 nm/min to 1000 nm/min, and 300 nm/min to 1500 nm/min, respectively. It could be understood that, the density of each layer of structure may be represented by the etch rate of the layer of structure in the second insulation layer, the layer of structure having a relatively large density has a relatively low etch rate, and the layer of structure having a relatively small density has a relatively high etch rate. Meanwhile, it could be understood that, the density of each layer of structure of the second insulation layer may be set appropriately, so that annular steps are formed more easily in the inner wall of the second via hole in a subsequent step of etching the second insulation layer. It is verified by experiments that, when the etch rate of the second layer of structure of the second insulation layer is smaller than that of the third layer of structure by 100 nm/min to 700 nm/min, that is, when the difference between the densities of the second layer of structure and the third layer of structure is relatively large, relatively perfect annular steps may be formed on the inner wall of the second via hole in the subsequent step of etching the second insulation layer. In this case, the diameter of the annular step formed at the interface between the second layer of structure and the third layer of structure of the second insulation layer in the subsequent step may be regarded as the aperture of the second via hole to be monitored.

In step 3, a pattern comprising the first via holes and the second via holes are formed on the substrate subjected to the above steps, by patterning process.

In this step, an organic film is formed on the fourth layer of structure of the second insulation layer by using a coating (comprising spin-coating) method. The organic film is made of organic resin, which comprises acrylic film-forming resin, phenolic film-forming resin, vinyl polymer film-forming resin or polyimide film-forming resin. Then, the first via holes penetrating through the first insulation layer and the second insulation layer and used for connecting the first signal lines with the first driving chip and the second via holes penetrating through the second insulation layer and used for connecting the second signal lines with the second driving chip are formed by patterning process. The position of each step is the position of interface between any two adjacent layers of structures in the second insulation layer, and the diameter of the circle formed by each step increases sequentially along the direction away from the first insulation layer.

At this point, the fabrication of the via holes in the fan-out region on the display panel is completed.

It should be noted that, the example of fabricating the second insulation layer having four layers of structures is only described in the embodiment, and a second insulation layer having more than four layers of structures may also be fabricated by the same method, as long as the flow rates of gases, the reaction power, the reaction pressure and the reaction distance are controlled correspondingly.

It could be understood that, in the method of the embodiment, the layers of structures of the formed second insulation layer comprise at least four layers, and thus the annular steps can be formed on the inner wall of the second via hole formed by etching the second insulation layer. In this case, compared with a second insulation layer having a single layer of structure, the monitored aperture of the second via hole in the second insulation layer of the embodiment may be changed, that is, the monitored aperture of the second via hole may be reduced, so that the second insulation layer can completely wrap the pins of the second driving chip inserted into the second via holes, thereby preventing the external environment from contaminating the pins of the second driving chip and the second signal lines below the second via holes, and further avoiding the failure.

Another embodiment of the present invention provides a display device comprising the display panel described in the above embodiment. The display device of the embodiment has a better performance and a higher yield.

The display device of the embodiment may be a liquid crystal display device of any mode such as TN, ADS, IPS, LTPS, etc. The display device may be any product or component with a display function, such as a liquid crystal panel, a liquid crystal TV set, a display, a mobile phone, a navigator, etc.

It should be understood that the above embodiments are only exemplary embodiments for illustrating the principle of the present invention, but the present invention is not limited thereto. Various variations and improvements can be made by a person of ordinary skill in the art without departing from the spirit and essence of the present invention, and these variations and improvements should also be considered to fall within the protection scope of the present invention.

What is claimed is:

1. A method of fabricating a display panel, the display panel comprising a pixel region and a fan-out region, the method comprising steps of sequentially forming first signal lines, a first insulation layer, second signal lines and a second insulation layer on a substrate, the first signal lines and the second signal lines being provided in the pixel region to intersect each other, and extending from the pixel region into the fan-out region, respectively, wherein the step of forming the second insulation layer comprises sequentially forming, on the substrate having the second signal lines formed thereon, at least four layers of insulation films, densities of materials for forming the at least four layers of insulation films decreasing layer by layer, to form the layers of structures of the second insulation layer;

the second insulation layer comprises four layers of structures, the step of sequentially forming the four layers of structures of the second insulation layer on the substrate having the second signal lines formed thereon comprises: forming the second insulation layer by a chemical vapor deposition process using reaction gases of NH3, N2 and SiH4 under a temperature ranging from 250° C. to 400° C.; and wherein when forming the first layer of structure of the second insulation layer, a flow rate of SiH4 ranges from 500 sccm to 1500 sccm, a flow rate of NH3 ranges from 2000 sccm to 4000 sccm, a flow rate of N2 ranges from 10000 sccm to 30000 sccm, a reaction power ranges from 3000 W to 6000 W, a reaction pressure ranges from 500 mtorr to 1000 mtorr, and a reaction distance ranges from 500 mils to 1500 mils;

when forming the second layer of structure of the second insulation layer, the flow rate of SiH4 ranges from 1000 sccm to 2000 sccm, the flow rate of NH3 ranges from 3000 sccm to 5000 sccm, the flow rate of N2 ranges from 10000 sccm to 30000 sccm, the reaction power ranges from 3000 W to 7000 W, the reaction pressure ranges from 800 mtorr to 1500 mtorr, and the reaction distance ranges from 800 mils to 1500 mils;

when forming the third layer of structure of the second insulation layer, the flow rate of SiH4 ranges from 1000 sccm to 2000 sccm, the flow rate of NH3 ranges from 3000 sccm to 7000 sccm, the flow rate of N2 ranges from 10000 sccm to 30000 sccm, the reaction power ranges from 3000 W to 7000 W, the reaction pressure ranges from 1000 mtorr to 2500 mtorr, and the reaction distance ranges from 800 mils to 1500 mils; and when forming the fourth layer of structure of the second insulation layer, the flow rate of SiH4 ranges from 1000 sccm to 2000 sccm, the flow rate of NH3 ranges from 4000 sccm to 8000 sccm, the flow rate of N2 ranges from 10000 sccm to 30000 sccm, the reaction power ranges from 5000 W to 7000 W, the reaction pressure ranges from 2000 mtorr to 3000 mtorr, and the reaction distance ranges from 800 mils to 1500 mils.

2. The method of claim 1, wherein each layer of structure of the second insulation layer is made of the same material.

3. The method of claim 1, wherein the display panel further comprises a driving circuit region, the fan-out region is provided between the pixel region and the driving circuit region, the driving circuit region comprises first driving chips and second driving chips, after forming the second insulation layer, the method further comprises:

forming first via holes penetrating through the first insulation layer and the second insulation layer in the fan-out region, and forming second via holes penetrating through the second insulation layer in the fan-out region by patterning process, so that the first driving chip is electrically connected with the first signal lines through the first via holes, and the second driving chip is electrically connected with the second signal lines through the second via holes, the second via hole has a step-like inner wall, and each step is positioned at an interface between any two adjacent layers of structures in the second insulation layer.

4. The method of claim 3, wherein a diameter of a circle formed by each step increases sequentially along a direction away from the first insulation layer.

5. The method of claim 1, wherein thicknesses of the four layers of structures of the second insulation layer are sequentially in ranges of 10 nm to 50 nm, 50 nm to 500 nm, 50 nm to 500 nm and 10 nm to 50 nm along a direction away from the first insulation layer.

6. The method of claim 1, wherein etch rates of the four layers of structures of the second insulation layer are sequentially in ranges of 300 nm/min to 600 nm/min, 300 nm/min to 800 nm/min, 300 nm/min to 1000 nm/min and 300 nm/min to 1500 nm/min along a direction away from the first insulation layer.

7. The method of claim 6, wherein the etch rate of the second layer of structure along a direction away from the first insulation layer is smaller than that of the third layer of structure by 100 nm/min to 700 nm/min in the four layers of structures of the second insulation layer.

* * * * *